(12) United States Patent
Noda et al.

(10) Patent No.: US 11,539,187 B2
(45) Date of Patent: Dec. 27, 2022

(54) SURFACE EMITTING LASER ELEMENT AND MANUFACTURING METHOD OF THE SAME

(71) Applicants: KYOTO UNIVERSITY, Kyoto (JP); STANLEY ELECTRIC CO., LTD., Tokyo (JP)

(72) Inventors: Susumu Noda, Kyoto (JP); Yoshinori Tanaka, Kyoto (JP); Menaka De Zoysa, Kyoto (JP); Tomoaki Koizumi, Tokyo (JP); Kei Emoto, Tokyo (JP)

(73) Assignees: KYOTO UNIVERSITY, Kyoto (JP); STANLEY ELECTRIC CO., LTD., Tokyo (JP)

( * ) Notice: Subject to any disclaimer, the term of this patent is extended or adjusted under 35 U.S.C. 154(b) by 280 days.

(21) Appl. No.: 16/956,512

(22) PCT Filed: Dec. 17, 2018

(86) PCT No.: PCT/JP2018/046367
§ 371 (c)(1),
(2) Date: Jun. 19, 2020

(87) PCT Pub. No.: WO2019/124312
PCT Pub. Date: Jun. 27, 2019

(65) Prior Publication Data
US 2021/0013700 A1    Jan. 14, 2021

(30) Foreign Application Priority Data
Dec. 22, 2017 (JP) .............................. JP2017-247048

(51) Int. Cl.
*H01S 5/11* (2021.01)
*H01S 5/183* (2006.01)
(Continued)

(52) U.S. Cl.
CPC ............ *H01S 5/18308* (2013.01); *H01S 5/11* (2021.01); *H01S 5/185* (2021.01); *H01S 5/2081* (2013.01);
(Continued)

(58) Field of Classification Search
CPC .......... H01S 5/11; H01S 5/185; H01S 5/2081; H01S 2304/04
See application file for complete search history.

(56) References Cited

U.S. PATENT DOCUMENTS 7,978,745 B2    7/2011  Noda et al.
8,129,210 B2    3/2012  Kawashima et al.
(Continued)

FOREIGN PATENT DOCUMENTS

JP    2003023193 A       1/2003
JP    2007067182    *    3/2007
(Continued)

OTHER PUBLICATIONS

Japanese Office Action dated Jan. 4, 2022 (and English translation thereof) issued in Japanese Application No. 2017-247048.
(Continued)

*Primary Examiner* — Michael Carter
(74) *Attorney, Agent, or Firm* — Holtz, Holtz & Volek PC

(57) ABSTRACT

A surface emission laser formed of a group III nitride semiconductor includes a first conductivity type first clad layer; a first conductivity type first guide layer on the first clad layer; a light-emitting layer on the first guide layer; a second guide layer on the light-emitting layer; and a second conductivity type second clad layer on the second guide layer. The first or second guide layer internally includes voids periodically arranged at square lattice positions with two axes perpendicular to one another as arrangement directions in a surface parallel to the guide layer. The voids
(Continued)

have a polygonal prism structure or an oval columnar structure with a long axis and a short axis perpendicular to the long axis in the parallel surface, and the long axis is inclined with respect to one axis among the arrangement directions of the voids.

12 Claims, 13 Drawing Sheets

(51) Int. Cl.
  *H01S 5/20* (2006.01)
  *H01S 5/343* (2006.01)
  *H01S 5/185* (2021.01)

(52) U.S. Cl.
  CPC ...... *H01S 5/34333* (2013.01); *H01S 2304/04* (2013.01)

(56) References Cited

U.S. PATENT DOCUMENTS

| | | | |
|---|---|---|---|
| 8,605,769 B2 | 12/2013 | Yoshimoto et al. | |
| 8,791,025 B2 | 7/2014 | Kawashima et al. | |
| 9,437,684 B2 | 9/2016 | Kawashima et al. | |
| 9,583,914 B2 | 2/2017 | Hirose et al. | |
| 10,389,088 B2 | 8/2019 | Kurosaka et al. | |
| 11,283,243 B2 * | 3/2022 | Noda | H01L 21/0262 |
| 2004/0247009 A1 * | 12/2004 | Noda | H01S 5/11 372/99 |
| 2007/0280318 A1 | 12/2007 | Yoshimoto et al. | |
| 2009/0016395 A1 | 1/2009 | Noda et al. | |
| 2009/0268291 A1 * | 10/2009 | Wang | G02B 5/3058 359/485.01 |
| 2011/0039364 A1 | 2/2011 | Kawashima et al. | |
| 2011/0044365 A1 | 2/2011 | Chen et al. | |
| 2011/0237077 A1 | 9/2011 | Kawashima et al. | |
| 2014/0327015 A1 | 11/2014 | Kawashima et al. | |
| 2016/0020581 A1 | 1/2016 | Hirose et al. | |
| 2018/0109075 A1 | 4/2018 | Kurosaka et al. | |
| 2019/0356113 A1 | 11/2019 | Kurosaka et al. | |

FOREIGN PATENT DOCUMENTS

| | | |
|---|---|---|
| JP | 2007067182 A | 3/2007 |
| JP | 4818464 B2 | 7/2010 |
| JP | 2011035078 A | 2/2011 |
| JP | 2012015228 A | 1/2012 |
| JP | 5082447 B2 | 9/2012 |
| JP | 2013135001 A | 7/2013 |
| JP | 2014197659 A | 10/2014 |
| WO | 2016148075 A1 | 9/2016 |

OTHER PUBLICATIONS

U.S. Appl. No. 16/488,595; First Named Inventor: Susumu Noda; Title: "Surface-Emitting Laser and Method for Manufacturing Surface-Emitting Laser"; filed Aug. 25, 2019.
International Search Report (ISR) (and English translation thereof) dated Mar. 5, 2019 issued in International Application No. PCT/JP2018/046367.
Written Opinion dated Mar. 5, 2019 issued in International Application No. PCT/JP2018/046367.
Kawashima, et al., "GaN-based surface-emitting laser with two-dimensional photonic crystal acting as distributed-feedback grating and optical cladding", Applied Physics Letters, Dec. 22, 2010, vol. 97, p. 251112.
Liang, et al., "Three-dimensional coupled-wave model for square-lattice photonic crystal lasers with transverse electric polarization: A general approach", Phys. Rev. B vol. 84 (2011) 195119.
Miyake, et al., "Effects of Reactor Pressure on Epitaxial Lateral Overgrowth of GaN via Low-Pressure Metalorganic Vapor Phase Epitaxy", Japan Journal of Applied Physics, vol. 38 (1999) pp. L1000-L1002.
Tanaka, et al., "Discussion of In-plane Diffraction and Threshold Gain Difference in PCSEL", Preprints of Autumn Meeting of 2016 of the Japan Society of Applied Physics, 15p-B4-20.
Yokoyama, et al., "Polarization Mode Control of Two-Dimensional Photonic Crystal Laser Having a Square Lattice Structure", IEEE Journal of Quantum Electronics, Sep. 2003, vol. 39, No. 9, pp. 1074-1080.
Yoshida, et al., "Elliptical Double-Hole Photonic-Crystal Surface-Emitting Lasers", 2017 Conference on Lasers and Electro-Optics Pacific Rim(CLEO-PR), Jul. 2017.
Japanese Office Action dated Jul. 5, 2022 (and English translation thereof) issued in counterpart Japanese Application No. 2017-247048.

* cited by examiner

SURFACE EMITTING LASER ELEMENT AND MANUFACTURING METHOD OF THE SAME

TECHNICAL FIELD

The present invention relates to surface emitting laser element and a manufacturing method of the same.

BACKGROUND ART

Recently, a development of a surface emission laser using a photonic crystal has been advanced. For example, Patent Document 1 discloses a semiconductor laser device whose object is to perform manufacturing without fusion process.

Additionally, Patent Document 2 discloses a manufacturing method that manufactures a microstructure of a photonic crystal into a GaN-based semiconductor. Non-Patent Document 1 discloses that a reduced-pressure growth increases a speed of a lateral growth to manufacture a photonic crystal.

Non-Patent Document 2 discloses an in-plane diffraction effect and a threshold gain difference of a photonic crystal laser. Non-Patent Document 3 discloses a three-dimensional coupled wave model of a square lattice photonic crystal laser.

Patent Document 1: Japanese Patent No. 5082447
Patent Document 2: Japanese. Patent No. 4818464
Non-Patent Document 1: H. Miyake et al.: Jpn. J. Appl. Phys. Vol. 38 (1999) pp. L1000-L1002
Non-Patent Document 2: Tanaka et al., Preprints of Autumn Meeting of 2016 of the Japan Society of Applied Physics, 15 p-B4-20
Non-Patent Document 3: Y. Liang et al.: Phys. Rev. B Vol. 84 (2011) 195119

DISCLOSURE OF THE INVENTION

Problems to be Solved by the Invention

To obtain a high resonance effect in the surface emission laser that has the photonic crystal, enhancing a diffraction effect in a photonic crystal layer is required. That is, to enhance the diffraction effect, uniform two-dimensional refractive index cycle in the photonic crystal, a large proportion (filling factor) of a different refractive index region to a base material in the photonic crystal, a large proportion (optical confinement factor) of an optical intensity (light field) in a direction perpendicular plane distributed in the photonic crystal, and the like are required.

Additionally, a stable single lateral mode operation is preferably obtained in the photonic crystal laser. Especially, it is preferred that a high-order transverse mode is reduced and the stable single lateral mode operation is obtained in a high output operation.

The present invention has been made in consideration of the above-described points and an object of which is to provide a surface emission laser that has a photonic crystal having a uniform refractive index cycle and having a high diffraction effect, and a manufacturing method of the same. Additionally, the object is to provide a surface emission laser that has a photonic crystal having a large filling factor and a large optical confinement factor, and a manufacturing method of the same.

Furthermore, the object is to provide a surface emission laser that reduces a high-order transverse mode, obtains a stable single lateral mode operation even in a high output operation, and features high beam quality, and a manufacturing method of the same.

Solutions to the Problems

A surface emission laser according to a first embodiment of the present invention is a surface emission laser formed of a group III nitride semiconductor comprising: a first conductivity type first clad layer; a first conductivity type first guide layer formed on the first clad layer; a light-emitting layer formed on the first guide layer; a second guide layer formed on the light-emitting layer; and a second conductivity type second clad layer formed on the second guide layer, the second clad layer having a conductivity type opposite to the first conductivity type. The first guide layer or the second guide layer internally includes voids periodically arranged at square lattice positions with two axes perpendicular to one another as arrangement directions in a surface parallel to the guide layer, and the voids have a polygonal prism structure or an oval columnar structure having a polygonal shape or an oval shape with a long axis and a short axis perpendicular to the long axis in the parallel surface, and the long axis is inclined with respect to one axis among the arrangement directions of the voids by an inclination angle θ.

Another embodiment of the present invention is a method of manufacturing a surface emission laser formed of a group lll nitride semiconductor by a MOVPE method, the method including:

(a) growing a first conductivity type first clad layer on a substrate;

(b) growing a first conductivity type first guide layer on the first clad layer;

(c) forming hole portions periodically arranged at square lattice positions with two axes perpendicular to one another as arrangement directions in a surface parallel to the first guide layer in the first guide layer by etching; and (d) obstructing upper portions of the hole portions by supplying a gas containing a group lll raw material and a nitrogen source so that the surface of the first guide layer becomes flat.

The hole portions have a polygonal prism structure or an oval columnar structure having a polygonal shape or an oval shape with a long axis and a short axis perpendicular to the long axis in the surface parallel to the first guide layer, the hole portions have a direction of the long axis in an <11-20> direction, and the long axis is inclined with respect to one axis among the arrangement directions of the hole portions by an inclination angle θ.

BRIEF DESCRIPTION OF THE DRAWINGS

FIG. 88 is a drawing illustrating an enlarged shape of the void 14C.

DESCRIPTION OF PREFERRED EMBODIMENTS

Figure 1:
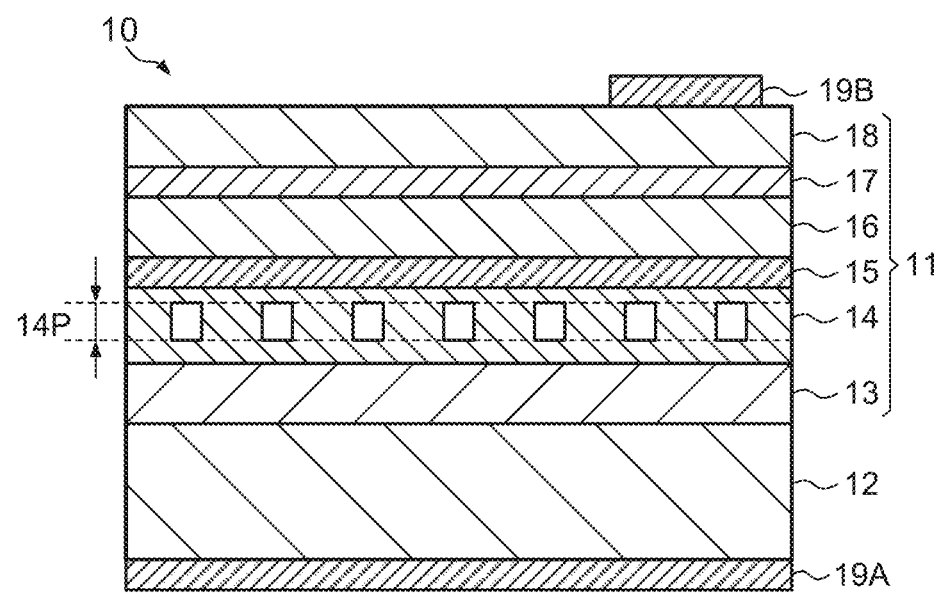
FIG. 1 is a cross-sectional view schematically illustrating an example of a structure of a surface emission laser including a photonic crystal layer.

While the following describes preferred embodiments of the present invention, these embodiments may be appropriately modified and combined. In the following description and attached drawings, same reference numerals are given to actually same or equivalent parts for the description.

[Threshold Gain of Photonic Crystal Surface Emission Laser]

When the surface emission laser having a photonic crystal is operated at high output, oscillation occurs not only in a basic lateral mode (hereinafter also simply referred to as a basic mode) but also in a high-order transverse mode (hereinafter also simply referred to as a high-order mode), which becomes a multi-mode. To achieve the high output operation with the basic mode performance maintained, a threshold gain difference between the basic mode and the high-order mode needs to be increased.

Generally, in the photonic crystal surface emission laser (hereinafter also simply referred to as a photonic crystal laser), diffraction efficiency of diffraction grating inside a resonator is expressed by a coupling coefficient k, and the larger the coupling coefficient k is, the smaller the threshold gain becomes.

In the photonic crystal surface emission laser, a light wave that propagates inside a surface parallel to the photonic crystal layer is diffracted not only in ±180° direction with respect to a traveling direction of the light wave but also in ±90° direction with respect to the traveling direction. That is, in addition to a coupling coefficient $k_3$ (one-dimensional coupling coefficient) of the light wave that propagates in the direction parallel to the traveling direction of the light wave that propagates inside the surface parallel to the photonic crystal layer, a coupling coefficient $k_{2D}$ (two-dimensional coupling coefficient) of the light wave that propagates in the 90° direction is present.

To increase the threshold gain difference between the basic mode and the high-order mode, decreasing the coupling coefficient $k_3$ is effective, and further increasing the coupling coefficient $k_{2D}$ is more effective (for example, see Non-Patent Document 2). However, this causes a problem in an increase in a threshold gain of the photonic crystal layer itself. In view of this, to increase the threshold gain difference from the high-order mode and obtain the stable oscillation in the basic mode, the coupling coefficient $k_3$ is decreased while the coupling coefficient $k_{2D}$ is increased at the same time.

[Example of Structure of the Photonic Crystal Surface Emission Laser]

FIG. 1 is a cross-sectional view schematically illustrating an example of the structure of a surface emission laser (hereinafter also simply referred to as a photonic crystal laser) 10 including a photonic crystal layer. As illustrated in FIG. 1, a semiconductor structure layer 11 is formed on a substrate 12. More specifically, on the substrate 12, an n-clad layer 13, an n-guide layer 14, an active layer 15, a guide layer 16, an electronic barrier layer 17, and a p-clad layer 18 are sequentially formed in this order. That is, the semiconductor structure layer 11 is constituted of the semiconductor layers 13, 14, 15, 16, 17, and 18. The n-guide layer 14 includes a photonic crystal layer 14P, The semiconductor structure layer 11 is formed of a hexagonal system nitride semiconductor. For example, a GaN base, InN, or AlN and a mixed crystal material of these substances can be used.

Additionally, an n-electrode 19A is formed on (a back surface of) the substrate 12, and a p-electrode 19B is formed on (an upper surface of) the p-clad layer 18.

Note that, as an n-electrode material, for example, Ti/Al/Pt/Au, Ti/Al/Pt/Au, and Ti/Ni/Au can be used. As a p-electrode material, for example, Ni/Au and Pd/Ti/Pt/Au can be used.

The substrate only needs to be a substrate that performs c-plane GaN growth, and, for example, a GaN substrate, a SiC substrate, or a sapphire substrate can be used.

A light from the surface emission laser 10 is extracted to the outside from an upper surface of the semiconductor structure layer 11 (namely, a surface of the p-clad layer 18) in a direction perpendicular to the active layer 15. Note that the light heading from the active layer 15 to a lower surface is reflected to the upper surface by the n-electrode 19A and is extracted to the outside from the upper surface.

Alternatively, the light from the surface emission laser 10 may be extracted to the outside from a lower surface of the semiconductor structure layer 11 (namely, a lower surface of the n-clad layer 13). In the case where the light is extracted from the n-clad side, for example, it can be configured by shaping the n-electrode so as to have a circular hole window at the center and forming the p-electrode opposed to the circular hole window.

[Arrangement of Voids in the Photonic Crystal Layer]

Figure 2A:
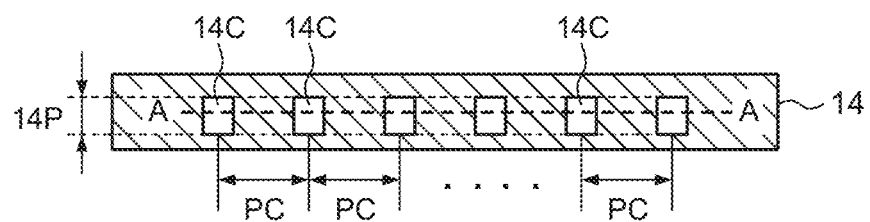
FIG. 2A is a cross-sectional view schematically illustrating the photonic crystal layer and voids 14C arranged in the photonic crystal layer.
Figure 2B:
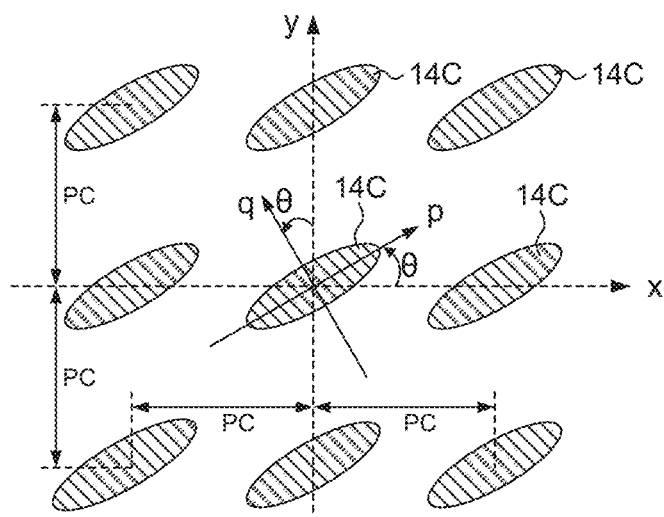
FIG. 2B is a plan view schematically illustrating the arrangement of the voids in a surface parallel to an n-guide layer.

FIG. 2A is a cross-sectional view schematically illustrating the photonic crystal layer 14P and voids (cavities) 14C arranged in the photonic crystal layer 14P. FIG. 2B is a plan view schematically illustrating the arrangement of the voids 14C in a crystal growth surface (semiconductor stacked surface), that is, a surface parallel to the n-guide layer 14 (a cross-sectional surface taken along A-A in the drawing).

Figure 2C:
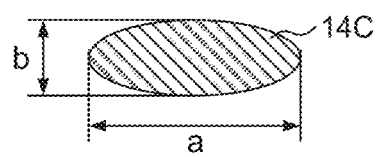
FIG. 2C is a drawing illustrating an ellipse ratio ER=major axis/minor axis (=a/b).

As illustrated in FIG. 2B, inside the surface parallel to the n-guide layer 14, the voids 14C having an elliptical shape (or an oval shape) are formed by being two-dimensionally arranged in a square lattice pattern at an interval PC, that is, square lattice positions (or square lattice points) at the regular interval PC in an x-direction and a y-direction perpendicular to the x-direction and embedded into the n-guide layer 14. As illustrated in FIG. 2C, an ellipse ratio of the elliptical shape of the void 14C is expressed by an ellipse ratio ER=major axis/minor axis (=a/b).

Note that the arrangement interval PC of the voids 14C can be determined according to an oscillation wavelength of the active layer 15 and an effective refractive index of the photonic crystal layer 14P so as to ensure obtaining a high diffraction effect in the photonic crystal layer 14P.

As illustrated in the cross-sectional view of FIG. 2B, the void 14C is formed such that a long-axis direction and a short-axis direction (a p-direction and a q-direction) of this ellipse of the void 14C are inclined by an angle θ (hereinafter referred to as an inclination angle) with respect to the arrangement directions of the voids 14C (the x-direction and the y-direction). In other words, around the square lattice positions of the arrangement (x,y)=(mXPC, nXPC) On and n are integers), the long-axis direction and the short-axis direction (the p-direction and the q-direction) are rotated by the angle θ with respect to the arrangement directions (the x-direction and the y-direction).

Thus, in the photonic crystal laser including the photonic crystal layer in which the voids are arranged in the square lattice pattern, the void cross-sectional shape in the photonic crystal layer surface is formed to be asymmetric with respect to a 90°-rotation around the cross-sectional surface center. This allows reducing the coupling coefficient $k_3$ and increasing the coupling coefficient $k_{2D}$ at the same time.

[Coupling Coefficients $k_3$ and $k_{2D}$ when the Void Cross-Sectional Shape is the Ellipse]

Next, simulation results of a relationship of the coupling coefficient $k_3$ and the coupling coefficient $k_{2D}$ when the cross-sectional shape of the void 14C is the ellipse will be described. Note that the simulation solved the formula (A13) of Non-Patent Document 3 of the device model of FIG. 1 and FIGS. 2A to 2C to calculate the coupling coefficients $k_3$ and $k_{2D}$.

More specifically, as the device model, a structure in which an n-type $Al_{0.04}Ga_{0.96}N$-clad layer (layer thickness: 2000 nm), an n-type GaN guide layer (layer thickness: 350 nm), an active layer (layer thickness: 28.5 nm), a non-doped GaN guide layer (layer thickness: 100 nm), a p-type $Al_{0.18}Ga_{0.92}N$ electron block layer (layer thickness: 20 nm), and a p-type $Al_{0.06}Ga_{0.94}N$ clad layer (layer thickness: 600 nm) were sequentially stacked on a GaN substrate was used.

A void formation region in the n-type GaN guide layer in the device model was set in a range of 105 nm from a position at a layer thickness of 120 nm from the n-type clad layer side. That is, a structure in which an n-type GaN layer (layer thickness: 120 nm), an n-type GaN layer (layer thickness: 105 nm) in which voids were formed, and an n-type GaN layer (layer thickness: 130 nm) were stacked from the n-type clad layer side was formed.

The active layer in the device model was formed of a multiple quantum well structure and had a structure in which three stack pairs formed of a non-doped (iaN barrier layer (layer thickness: 6 nm) and a non-doped $In_{0.08}Ga_{0.92}N$ well layer (layer thickness: 3.5 nm) were stacked.

The calculation was performed using the atmospheric refractive index for the void 14C and the refractive index of each of the materials for each semiconductor layer.

When a complex refraction index of each coordinate of the modeled structure is defined as $$\tilde{n}(r) \quad \text{[Math. 1]}$$

, a light with a wave number $$k_0 \quad \text{[Math. 2]}$$

meets the following relational equation (the equation (2) in Non-Patent Document 3) by the Maxwell's equations. Note that this modeling will be described using the equations in Non-Patent Document 3.

[Math. 3]

$$\nabla \times \nabla \times E(r) = k_0^2 \tilde{n}^2(r) E(r), \quad (2)$$

The light propagating inside of the photonic crystal can be described by Blotch wave due to periodicity of the structure. Formulation of coupling of the fundamental wave in the Bloch wave derives the following coupled wave equation (15) (or (A13)) (for details, see Non-Patent Document 3).

[Math. 4]

$$(\delta + i\alpha)V = CV. \quad (15)$$

A coupled wave matrix of the equation. (15)

$$C \quad \text{[Math. 5]}$$

expresses a sum of $$C_{1D}, C_{rad}, C_{2D} \quad \text{[Math. 6]}$$

that expresses three kinds of coupling, and is expressed by

[Math. 3]

$$C = C_{1D} + C_{rad} + C_{2D}, \quad (A15)$$

$$C_{1D} \quad \text{[Math. 8]}$$

expresses coupling between the fundamental waves diffracting in the 180-degree direction, $$C_{rad} \quad \text{[Math. 9]}$$

expresses coupling between the fundamental waves via a radiation wave, and $$C_{2D} \quad \text{[Math. 10]}$$

expresses coupling via a high-order wave. They are expressed as

[Math. 11]

$$C_{1D} = \begin{pmatrix} 0 & \kappa_{2,0} & 0 & 0 \\ \kappa_{-2,0} & 0 & 0 & 0 \\ 0 & 0 & 0 & \kappa_{0,2} \\ 0 & 0 & \kappa_{0,-2} & 0 \end{pmatrix},$$ (A16)

[Math. 12]

$$C_{rad} = \begin{pmatrix} \zeta_{1,0}^{(0,1)} & \zeta_{1,0}^{(-1,0)} & 0 & 0 \\ \zeta_{-1,0}^{(0,1)} & \zeta_{-1,0}^{(-1,0)} & 0 & 0 \\ 0 & 0 & \zeta_{0,1}^{(0,1)} & \zeta_{0,1}^{(0,-1)} \\ 0 & 0 & \zeta_{0,-1}^{(0,1)} & \zeta_{0,-1}^{(0,-1)} \end{pmatrix},$$ (A17)

[Math. 13]

$$C_{2D} = \begin{pmatrix} \chi_{y,1,0}^{(0,1)} & \chi_{y,1,0}^{(-1,0)} & \chi_{y,1,0}^{(0,1)} & \chi_{y,1,0}^{(0,-1)} \\ \chi_{y,-1,0}^{(1,0)} & \chi_{y,-1,0}^{(-1,0)} & \chi_{y,-1,0}^{(0,1)} & \chi_{y,-1,0}^{(0,-1)} \\ \chi_{x,0,1}^{(1,0)} & \chi_{x,0,1}^{(-1,0)} & \chi_{x,0,1}^{(0,1)} & \chi_{x,0,1}^{(0,-1)} \\ \chi_{x,0,-1}^{(1,0)} & \chi_{x,0,-1}^{(-1,0)} & \chi_{x,0,-1}^{(0,1)} & \chi_{x,0,-1}^{(0,-1)} \end{pmatrix},$$ (A18)

respectively.

Among the elements of the coupled wave matrix C, elements expressing the coupling between the fundamental waves diffracted in the 180-degree direction are the following four elements.

$$C(1,2), C(2,1), C(3,4), C(4,3)$$ [Math. 14]

For example.

$$C(1,2)C_{1D}(1,2) + C_{rad}(1,2) + C_{2D}(1,2) = H_{2,0} + \delta_{1,0}^{(-1,0)} + X_{y,1,0}^{(-1,0)}$$ [Math. 15]

is met. In this application, an average value of these elements is denoted as $k_3$. That is, the average value can be obtained by $$K_3 = (C(1,2) + C(2,1) + C(3,4) + C(4,3))/4$$ [Math. 16]

Additionally, elements expressing the coupling between the fundamental waves diffracted in the 90-degree direction among the elements in the coupled wave matrix C are the following eight elements.

$$C(3,1), C(3,2), C(4,1), C(4,2), C(1,3), C(1,4), C(2,3), C(2,4)$$ [Math. 17]

For example, $$C(3,1) = C_{1D}(3,1) + C_{rad}(3,1) + C_{2D}(3,1) = 0 + 0 + X_{y,0,1}^{(1,0)}$$ [Math. 18]

is met. In this application, an average value of these elements is denoted as $k_{2D}$. That is, the average value can be obtained by $$k_{2D} = (C(3,1) + C(3,2)C(4,1) + C(4,2)C(1,3) + C(1,4) + C(2,3) + C(2,4))/8$$ [Math. 19]

Note that the simulation employed the device model as the reference and performed calculation using a plurality of device models with the ellipse ratio, the filling factor, and the inclination angle θ as parameters.

Figure 3A:
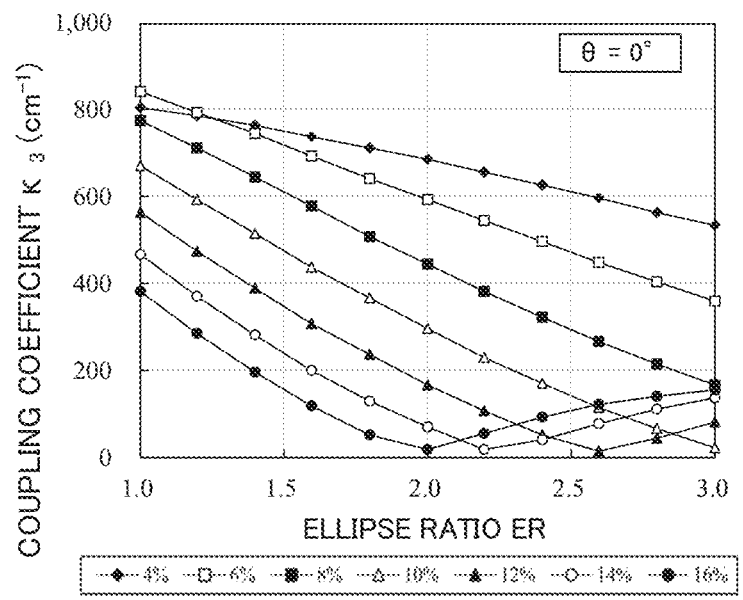
FIG. 3A is a drawing plotting coupling coefficients $k_3$ to the ellipse ratios ER when an inclination angle θ is 0° with an FF as a parameter.
Figure 3B:
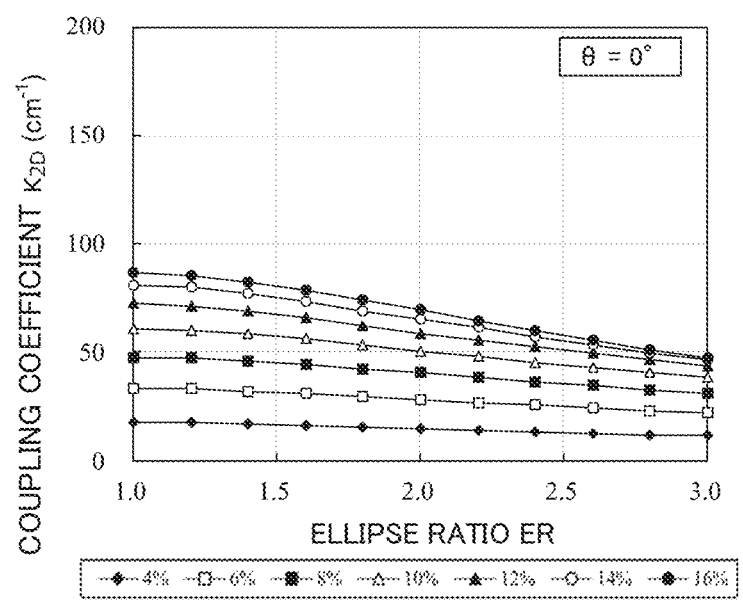
FIG. 3B is a drawing plotting coupling coefficients $k_{2D}$ to the ellipse ratios ER when the inclination angle θ is 0° with the FF as the parameter.
Figure 4A:
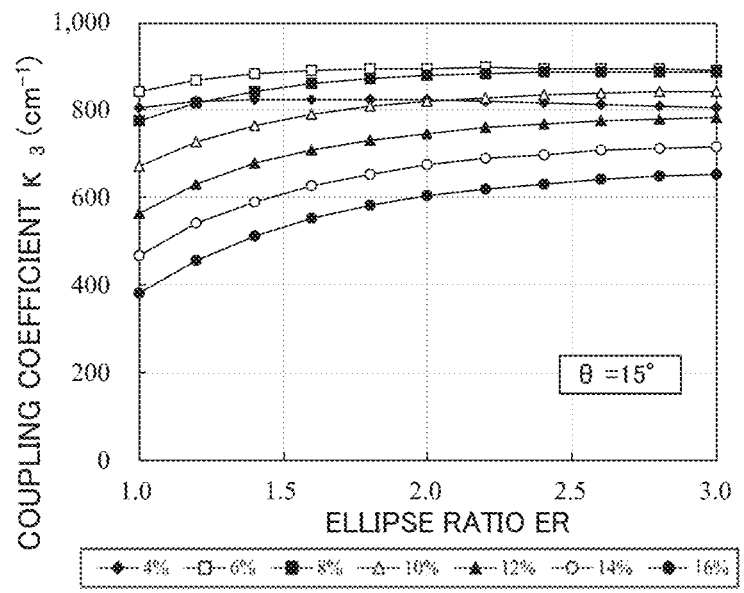
FIG. 4A is a drawing plotting coupling coefficients $k_3$ to the ellipse ratios ER when the inclination angle θ is 15° with the FF as the parameter.
Figure 4B:
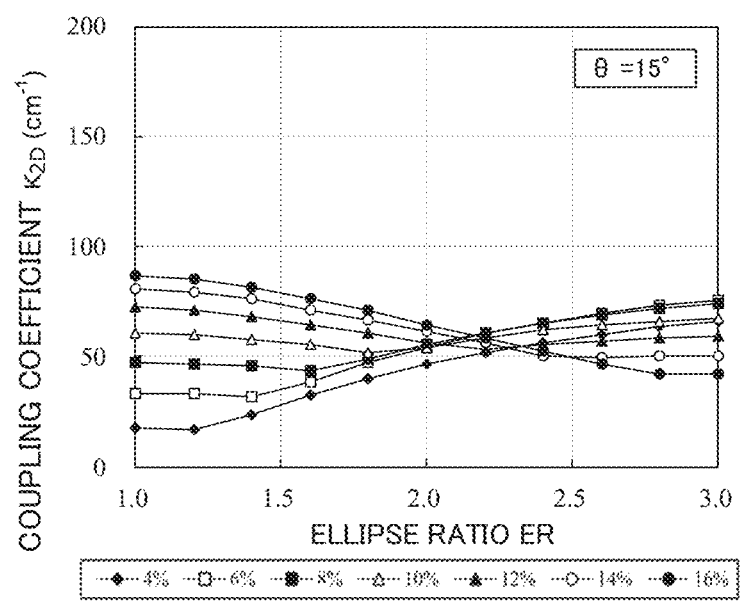
FIG. 4B is a drawing plotting coupling coefficients $k_{2D}$ to the ellipse ratios ER when the inclination angle θ is 15° with the FF as the parameter.
Figure 5A:
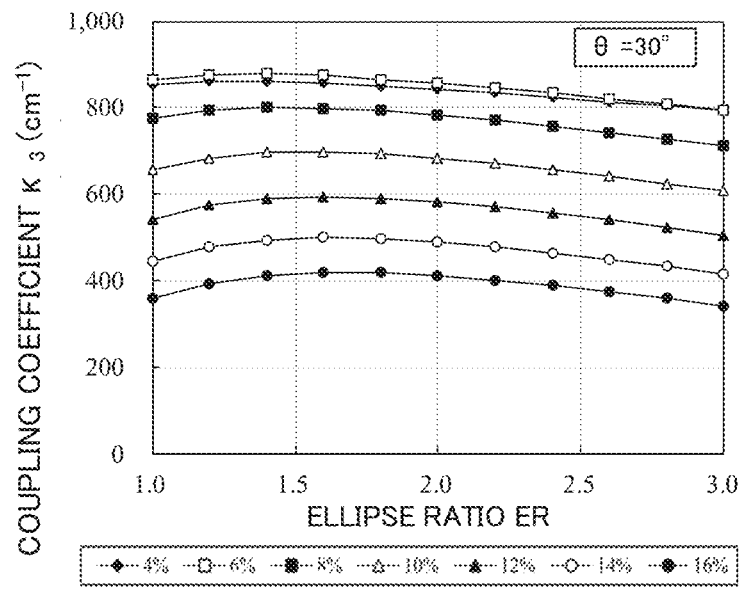
FIG. 5A is a drawing plotting coupling coefficients $k_3$ to the ellipse ratios ER when the inclination angle θ is 30° with the FF as the parameter.
Figure 5B:
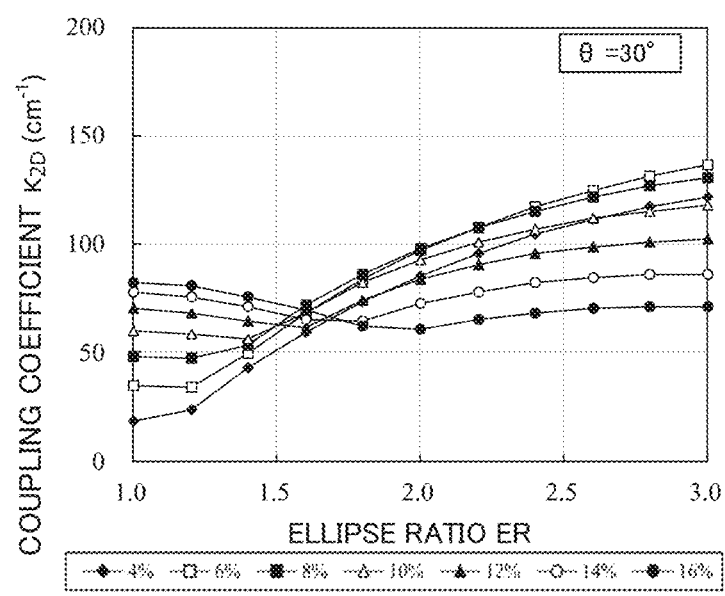
FIG. 5B is a drawing plotting coupling coefficients $k_{2D}$ to the ellipse ratios ER when the inclination angle θ is 30° with the FF as the parameter.
Figure 6A:
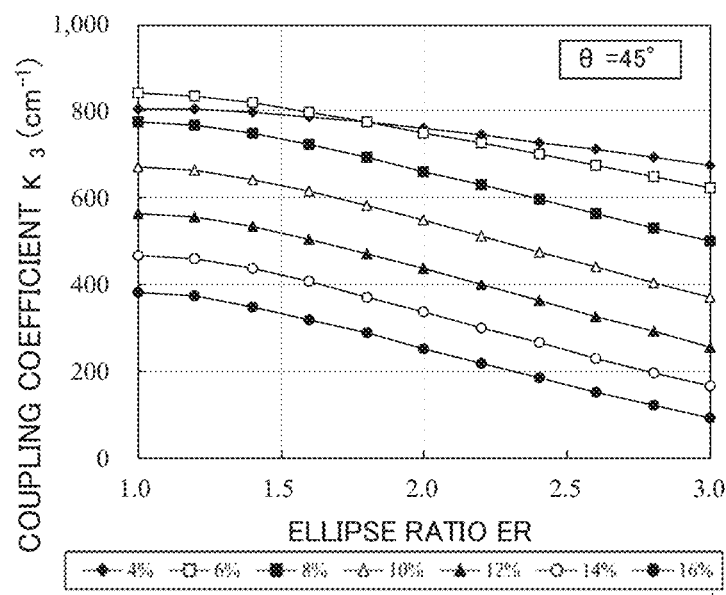
FIG. 6A is a drawing plotting coupling coefficients $k_3$ to the ellipse ratios ER when the inclination angle θ is 45° with the FF as the parameter.
Figure 6B:
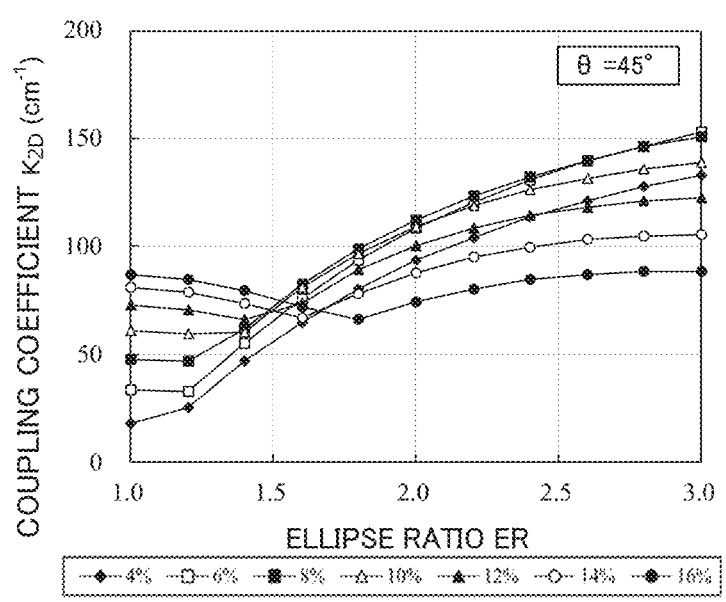
FIG. 6B is a drawing plotting coupling coefficients $k_{2D}$ to the ellipse ratios ER when the inclination angle θ is 45° with the FF as the parameter.

FIG. 3A and FIG. 3B are drawings plotting a relationship between each of the coupling coefficient $k_3$ and the coupling coefficient $k_{2D}$ and the ellipse ratio ER with the inclination angle θ of 0°. FIG. 4A and FIG. 4B are drawings plotting the relationship between each of the coupling coefficient $k_3$ and the coupling coefficient $k_{2D}$ and the ellipse ratio ER with the inclination angle θ of 15°. FIG. 5A and FIG. 5B are drawings plotting the relationship between each of the coupling coefficient $k_3$ and the coupling coefficient $k_{2D}$ and the ellipse ratio ER with the inclination angle θ of 30°. FIG. 6A and FIG. 6B are drawings plotting the relationship between each of the coupling coefficient $k_3$ and the coupling coefficient $k_{2D}$ and the ellipse ratio ER with the inclination angle θ of 45°. Note that FIG. 3A, FIG. 3B, FIG. 4A, FIG. 4B, FIG. 5A, FIG. 5B, FIG. 6A, and FIG. 6B are drawings plotting the filling factor (FF) as the parameter (FF=4%, 6%, 8%, 10%, 12%, 14%, and 16%).

Note that since the inclination angle θ is an angle of the square lattice arrangement with respect to the arrangement directions (the x-direction and the y-direction), considering the symmetric property of the square lattice, when this inclination angle is denoted as θ, it is sufficient that 0<θ≤45° is met. Therefore, the following describes the inclination angle θ as the angle of 0<θ≤45°. Note that the arrangement directions (the x-direction and the y-direction) are not limited, and any, direction in the photonic crystal layer surface is selectable.

Additionally, using an area $PC^2$ of one interval PC of the photonic crystal, the filling factor (FF) is obtained by FE=[ellipse area (πab)/area $(PC^2)$ of one interval].

In this simulation result, with the inclination angle θ of 0° (FIG. 3A and FIG. 3B), the coupling coefficient $k_3$ decreases as the ellipse ratio ER increases, and the coupling coefficient $k_{2D}$ also decreases.

It is found that, with the inclination angle θ of 15° (FIG. 4A and FIG. 4B), when the filling factor (FF) is small (FF=4%, 6%, and 8%), while the coupling coefficient $k_3$ does not substantially change relative to the increase in the ellipse ratio ER, the coupling coefficient $k_{2D}$ increases as the increase in the ellipse ratio ER at the ellipse ratio ER of approximately 1.4 or more. That is, while the coupling coefficient $k_{2D}$ becomes high depending on another parameter, the coupling coefficient $k_3$ does not decrease in accordance with the ellipse ratio ER. Therefore, the threshold gain difference between the basic mode and the higher order mode is less likely to increase.

With the inclination angle θ of 30° (FIG. 5A and FIG. 5B), the coupling coefficient $k_3$ decreases as the increase in the ellipse ratio ER at the ellipse ratio ER of approximately 1.4 or more. Meanwhile, it is found that, with the small filling factor (FE) (FE=4%, 6%, 8%, 10%, and 12%), the coupling coefficient $k_{2D}$ substantially increases as the increase in the ellipse ratio ER at the ellipse ratio ER of approximately 1.4 or more.

With the inclination angle θ of 45° (FIG. 6A and FIG. 6B), regardless of the magnitude of the filling factor (FE) (FE=4% to 16%), the coupling coefficient $k_3$ substantially decreases as the increase in the ellipse ratio ER. Meanwhile, it is found that the coupling coefficient $k_{2D}$ substantially increases as the increase in the ellipse ratio ER at the filling factor (FE) of 14% or less and the ellipse ratio ER of approximately 1.4 or more.

Figure 7A:
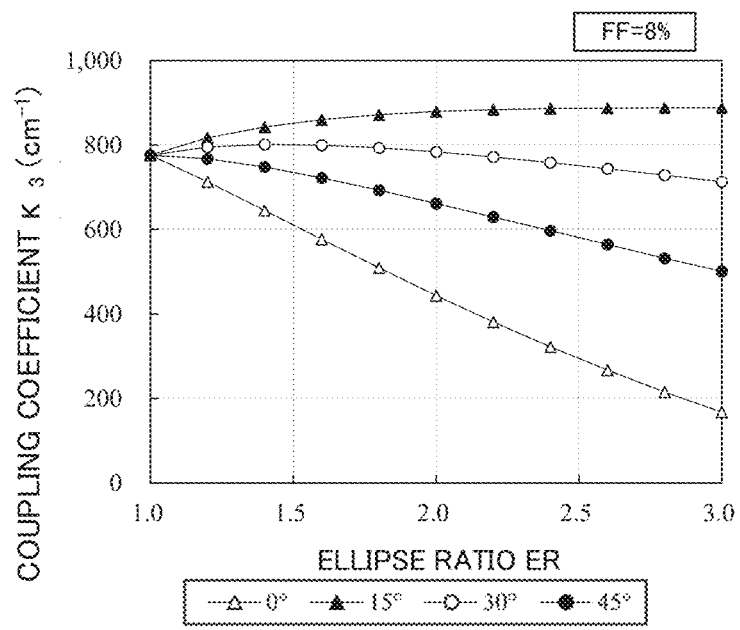
FIG. 7A is a drawing plotting coupling coefficients $k_3$ to the ellipse ratios ER when the FF is 8% with the inclination angle θ as the parameter.
Figure 7B:
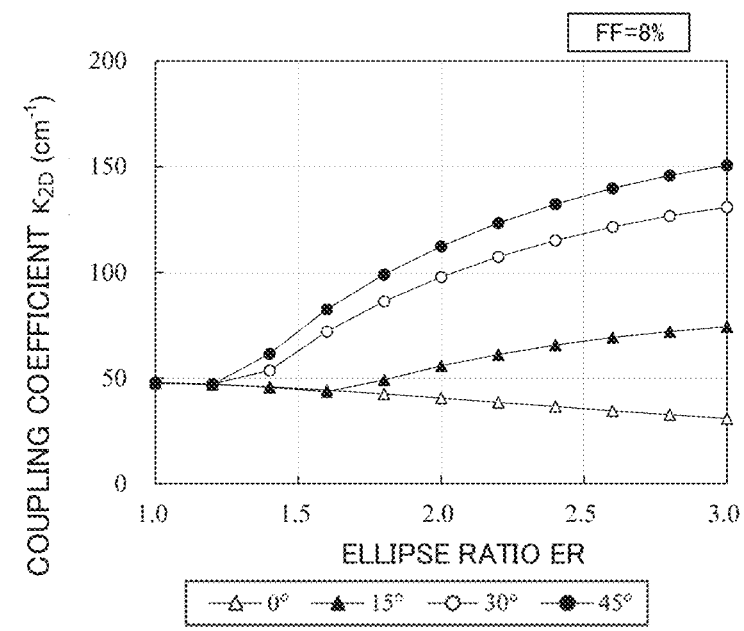
FIG. 7B is a drawing plotting coupling coefficients $k_{2D}$ to the ellipse ratios ER when the FF is 8% with the inclination angle θ as the parameter.

FIG. 7A and FIG. 7B are drawings each plotting a relationship between each of the coupling coefficient $k_3$ and the coupling coefficient $k_{2D}$ and the ellipse ratio ER with the filling factor (FE) of 8%. More specifically, FIG. 7A and FIG. 7B are drawings plotting the inclination angle θ as the parameter (θ=0°, 15°, 30°, 45°).

As illustrated in FIG. 7A and FIG. 7B, when the inclination angle θ is 0°, the especially appropriate ellipse ratio ER is absent. When the inclination angle θ is 15°, the coupling coefficient $k_{2D}$ starts increasing at the ellipse ratio ER of 1.6 or more. As illustrated in FIG. 7A, when the inclination angle θ is 30° or 45°, the coupling coefficient $k_3$ decreases as the increase in the ellipse ratio ER. Compared with the case of the inclination angle θ of 30°, the decrease rate of the coupling coefficient $k_3$ at the inclination angle θ of 45° is larger. Meanwhile, as illustrated in FIG. 7B, it is found that the coupling coefficient $k_{2D}$ substantially increases as the increase in the ellipse ratio ER at the inclination angle θ of 30° or 45°. Therefore, the inclination angle θ is preferably 30°≤θ≤45°, and the inclination angle θ=45° is further preferred.

From the simulation results described above, as a condition under which the coupling coefficient $k_3$ decreases and the coupling coefficient $k_{2D}$ increases, the inclination angle θ is preferably 15° or more (15°≤θ≤45°. Furthermore, the inclination angle θ is more preferably 30°≤θ≤45° and further the inclination angle θ=45° is the most preferred.

Note that when the lower limit of the filling factor (FF) is 4% or less in the case of θ=45° where the effect becomes the highest, the decrease in the coupling coefficient $k_3$ becomes gentle relative to the ellipse ratio ER (see FIG. 6A). That is, with the FF of 4% or less, the effect brought by the elliptical shape decreases. Therefore, the filling factor (FF) is preferably 6% or more. With the FF of 16%, the coupling coefficient $k_{2D}$ has the local minimum point relative to the ellipse ratio ER and even when the ellipse ratio ER is set to 3, the coupling coefficient $k_{2D}$ becomes an extent similar that in the case of the ellipse ratio ER of 1. Therefore, the FF is preferably in a range of from 6% to 14%.

In the case of θ=45°, when the ellipse ratio ER is 1.6 or more, $k_{2D}$ has the maximum value at the FF of from 8 to 10%. That is, when the FF becomes too large, the effect brought by the elliptical shape is reduced. In the case of θ=45° and the ellipse ratio of 1.6, when the FF exceeds 14%, $k_{2D}$ falls below compared with the case where the ellipse ratio is 0, and the effect brought by the elliptical shape cannot be obtained. Accordingly, the FF is further preferably in a range of from 6% to 12%.

Additionally, although the ellipse ratio is preferably 1.4 more, the ellipse at least fits into one interval (a square with a length of one side of PC) of the photonic crystal. Specifically, a long axis length a (FIG. 2C) of the ellipse is within one pitch of the photonic crystal. In a case where a is a length same as one pitch, for example, to set 8% to the FF, a short axis length b=0.102a and the ellipse ratio ER at this time is 9.8. In this case, the upper limit of the ellipse ratio ER is 9.8.

In the case of the inclination angle θ45° where the effect becomes the highest, the decrease in the coupling coefficient $k_3$ is observed when the ellipse ratio ER is greater than 1.4. That is, the ellipse ratio ER is preferably in a range of from 1.4 to 9.8.

Another Example of Void Shape

Figure 8A:
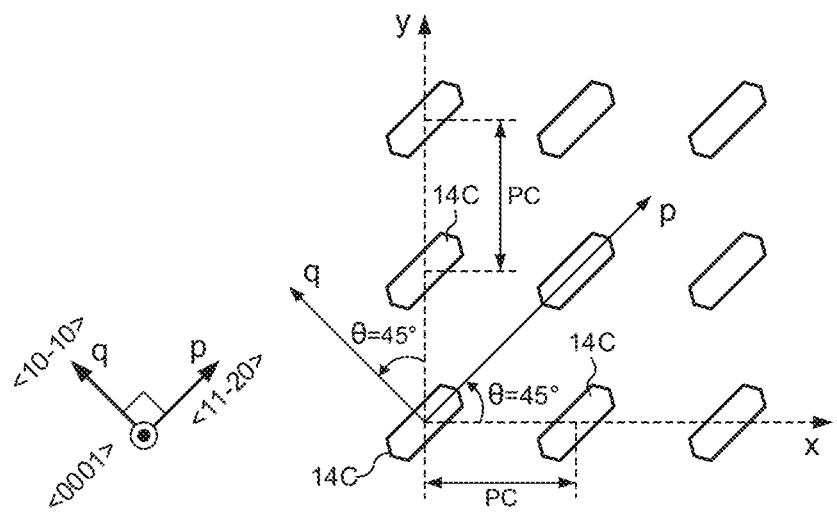
FIG. 8A is a drawing illustrating an arrangement of voids 14C when a void cross-sectional shape is a hexagonal shape.

FIG. 8A is a drawing illustrating the arrangement of the voids 14C when the void cross-sectional shape is a hexagonal shape. That is, similarly to the case of FIG. 2B, FIG. 8A is a cross-sectional view schematically illustrating the arrangement of the voids 14C in the surface (see the cross-sectional surface taken along A-A in FIG. 2A) parallel to the n-guide layer 14 (that is, the photonic crystal layer 14P).

Inside the surface parallel to the photonic crystal layer 14P, the voids 14C, having a hexagonal cross-sectional surface are formed by being two-dimensionally arranged periodically in the square lattice pattern at the interval PC, that is, the square lattice positions at the regular interval PC in the x-direction and the y-direction perpendicular to the x-direction and embedded into the n-guide layer 14.

Figure 8B:
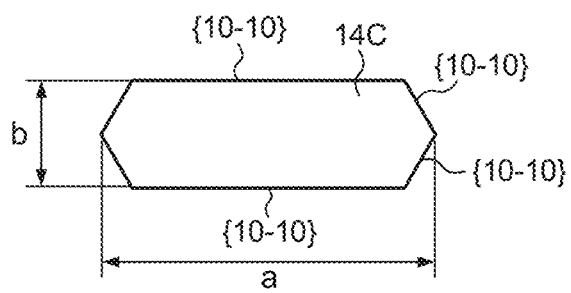

FIG. 8B is a drawing illustrating the enlarged cross-sectional shape of the void. 14C. As illustrated in FIG. 8B, the void 14C has the hexagonal cross-sectional surface having the long-axis direction in an <11-20> direction and two sides parallel to this <11-20> direction as long sides. Therefore, the void 14C has a hexagonal columnar structure having {10-10} planes (or in planes) parallel to this <11-20> direction as the two side surfaces (sidewalls or facets). In the case illustrated in FIG. 8B, the other four side surfaces (sidewalls) of this hexagonal columnar structure are facets of the {10-10} planes.

Additionally, an aspect ratio of the hexagonal shape in the cross sectional surface of the void 14C in this case is expressed by AR=long axis length/short axis length (=a/b).

However, in the void 14C, the side surfaces (sidewalls) other than the two {10-10} planes parallel to this long-axis direction may be surfaces or facets (crystal faces) having any shape, and in this case, the void 14C may have a polygonal prism structure.

With reference to FIG. 8A again, in the surface parallel to the photonic crystal layer 14P, the void 14C is formed such that these long-axis direction and short-axis direction (the p-direction and the q-direct) of the void 14C are inclined by the inclination angle θ=45° with respect to the periodic directions (the x-direction and the y-direction) of the arrangement of the voids 14C.

Figure 9:
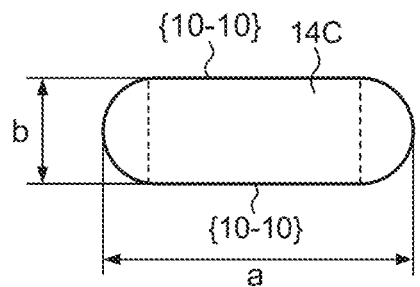
FIG. 9 is a drawing illustrating the void 14C having an oval shape in a surface parallel to a photonic crystal layer 14P.

Note that as illustrated in FIG. 9, the void 14C may have an oval columnar structure having an oval shape in the surface parallel to the photonic crystal layer 14P. More specifically, in the surface parallel to the photonic crystal layer 14P, the cross-sectional surface of the void 14C has the oval shape (ora rounded rectangle) having the long-axis direction in the <11-20> direction, having the two sides parallel to this <11-20> direction as long sides, and having semicircular both ends in the long-axis direction.

Accordingly, the void 14C has the oval columnar structure having the {10-10} planes (or the m planes) parallel to this long-axis direction as the two side surfaces (the sidewalls or the facets).

This specification will give the description in which the elliptical column structure having the elliptical cross-sectional surface having the major axis and the minor axis in the surface parallel to the photonic crystal layer 14P illustrated in FIG. 2B and FIG. 2C, and the oval columnar structure having the oval shaped (or the rounded rectangle) cross-sectional surface illustrated in FIG. 9 are both collectively referred to as an oval columnar structure.

Figure 14A:
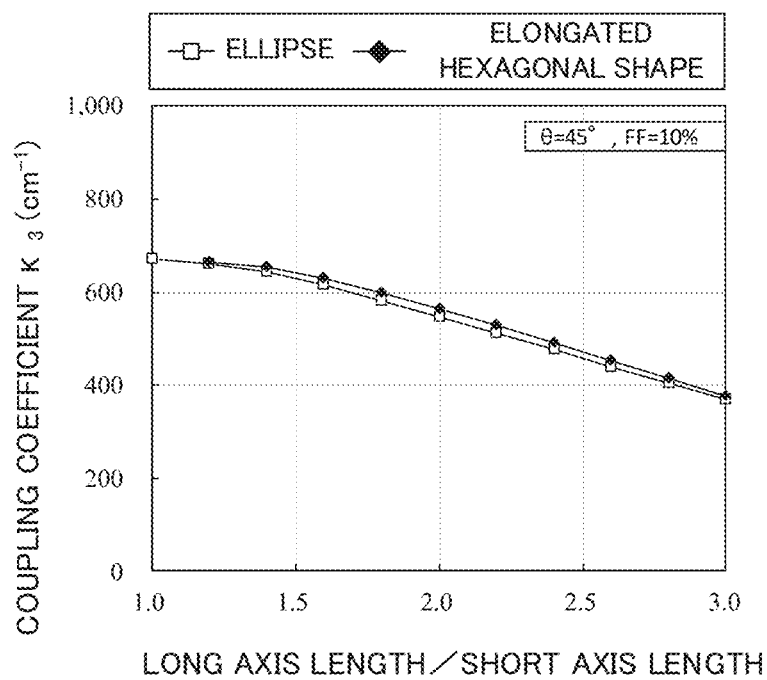
FIG. 14A is a drawing plotting the coupling coefficients $k_3$ to a long axis length/short axis length with the inclination angle θ=45° and the FF=10% in a case where a cross-sectional shape is an elliptical shape and an elongated hexagonal shape.
Figure 14B:
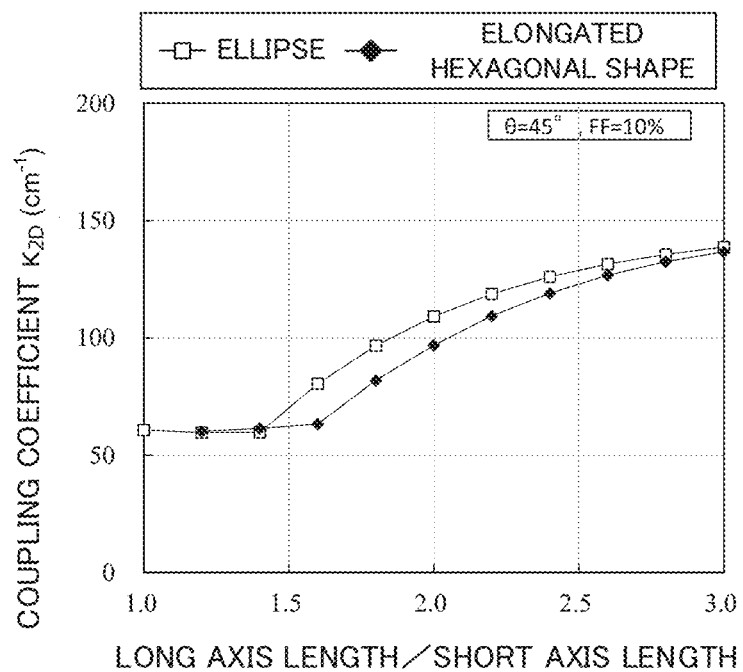
FIG. 14B is a drawing plotting the coupling coefficients $k_{2D}$ to the long axis length/short axis length with the inclination angle θ=45° and the FF=10% in the case where the cross-sectional shape is the elliptical shape and the elongated hexagonal shape.

Additionally, the above-described simulation results are about the relationship of the coupling coefficients $k_3$ and $k_{2D}$ when the cross-sectional shape of the void 14C in the surface parallel to the photonic crystal layer 14P is the ellipse. However, it has been confirmed that also in a case where this cross-sectional shape is a shape, such as a hexagonal shape (elongated hexagonal shape) and the rounded rectangle having the long axis and the short axis, as illustrated in FIGS. 14A and 14B (the case of the inclination angle θ=45° and FF=10%), there is no big difference in the simulation results. Therefore, in the case of other than the elliptical shape as well, by replacing the ellipse ratio ER with AR=long axis length/short axis length (=a/b), the simulation result can be applied.

[Growth of the Semiconductor Structure Layer 11]

The following describes a manufacturing step of the semiconductor structure layer 11 in detail. A Metalorganic Vapor Phase Epitaxy (MOVPE) method was used as a crystal growth method to grow the semiconductor structure layer 11 on the growth substrate 11 by normal pressure (atmospheric pressure) growth. Note that as long as epitaxial growth that allows generating mass transport described later is achieved, the method for the growth of the semiconductor structure layer 11 is not limited to the MOVPE method, and, for example, a Molecular Beam Epitaxy (MBE) method is also usable.

[Growth of Clad Layer and Guide Layer]

As a substrate for growth of the semiconductor structure layer 11, the n-type GaN substrate 12 having a +c plane as the growth surface was used. Accordingly, respective growth layers of the semiconductor structure layer 11 were grown as layers parallel to the c face.

An n-type AlGaN (layer thickness: 2 μm) with an aluminum (Al) composition of 4% was grown as the n-clad layer 13 on the substrate 12. As a MO (organic metal) material in the group III, Trimethyl Gallium (TMG) and Trimethyl Aluminum (TMA) were used, ammonia ($NH_3$) was used as a group V material, and a growth temperature was 1100°. As a doping material, disilane ($Si_2H_6$) was supplied. A carrier density at room temperature was approximately $4 \times 10^{18}$ $cm^{-3}$.

Subsequently, TMG and $NH_3$ were supplied to grow an n-type GaN (layer thickness: 300 nm) as the n-guide layer 14. Additionally, disila e ($Si_2H_6$) was supplied simultaneously with the growth and thus doping was performed. The carrier density was approximately $4 \times 10^{18}$ $cm^{-3}$.

Note that although the n-guide layer 14 in the semiconductor structure layer 11 is the crystal layer including the photonic crystal layer after the voids are embedded, here, the crystal layer (the GaN layer in this embodiment) before the voids are embedded will be also described as the n-guide layer 14.

[Formation of Voids in Guide Layer]

The substrate after the growth of the n-guide layer 14, namely, the substrate with the guide layer (hereinafter referred to as a guide layer substrate) was extracted from a MOVIE apparatus and fine voids (holes or hole portions) were formed in the n-guide layer 14.

Figure 10:
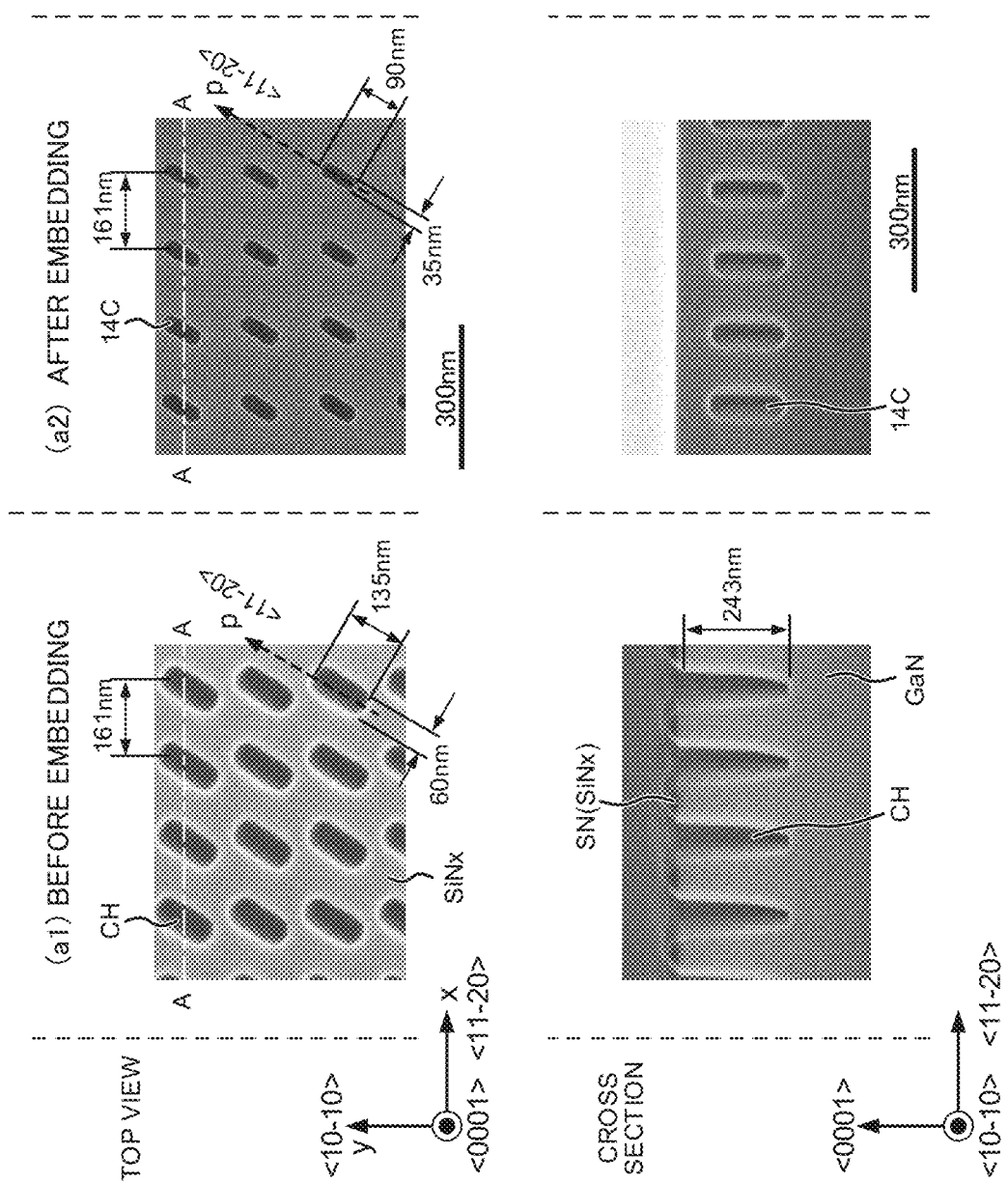
FIG. 10 includes SEM images illustrating cross-sectional surfaces of the voids before embedding (a1) and SEM images illustrating cross-sectional surfaces of the voids after the embedding (a2).

With reference to FIG. 10, the following describes the formation of the voids in detail. Note that FIG. 10 illustrates (a1) images of a Scanning Electron Microscope (SEM) illustrating cross-sectional surfaces of the void before embedding. Additionally, FIG. 10 illustrates (a2) SEM images illustrating cross-sectional surfaces of the voids after embedding. Note that the drawings on the upper stage are SEM images illustrating the cross-sectional surface parallel to the n-guide layer 14 and the drawings on the lower stage are SEM images illustrating the cross-sectional surface perpendicular to the n-guide layer 14 taken along the lines A-A. The SEM images on the upper stage were observation of a sample with the voids exposed by FID processing.

The guide layer substrate in which the n-clad layer 13 and the n-guide layer 14 had been grown on the substrate 12, was cleaned to obtain cleaned surfaces.

Afterwards, a silicon nitride film (SiNx) SN was formed (film thickness: 110 nm) by plasma CVD.

Next, a resist for Electron Beam (EB) drawing RZ was applied over the SiNx film SN by spin coating at a thickness around 300 nm and put in an electron beam drawing (EB) device to form a pattern having a two-dimensional periodic structure on a surface of the guide layer substrate (the upper stage of (a1) in FIG. 10).

More specifically, in the surface parallel to the photonic crystal layer 14P (namely, the c plane or the (0001) plane), oval-shaped (rounded-rectangular-shaped) through-holes having the <11-20> direction as the long-axis direction (the p-direction), the length in the long-axis direction of 135 nm, and the length (width) in the short-axis direction of 60 nm was patterned to be formed on the resist RZ. These through-holes were formed to be arranged at the interval of 161 nm at the square lattice positions while inclined with respect to the two-dimensional arrangement directions (the x-direction and the y-direction) by the inclination angle of θ=30°. Note that while the long-axis direction (the p-direction) of the through-hole in the resist RZ is the <11-20> direction, the x-direction is also the <11-20> direction equivalent to this direction.

After developing the patterned resist RZ, the SiNx film SN was selectively dry-etched by an Inductive Coupled Plasma-Reactive Ion Etching (ICP-RIE) apparatus. Thus, the through-holes two-dimensionally arranged at the square lattice positions at the in-plane interval PC of 161 nm and with a depth of 110 nm were formed on the SiNx film SN.

Subsequently, the resist RZ was removed, thus forming the voids CH from the surface of the n-guide layer 14 (GaN) to the de using the patterned SiNx film SN as a hard mask. More specifically, by performing dry etching using a chlorine-based gas by the ICP-RIE apparatus, the voids CH two-dimensionally arranged in the n-guide layer 14 were formed.

The void CH has the {10-10} planes as the two side surfaces (that is, the side surfaces corresponding to the long sides of this oval (rounded rectangle)) parallel to the <11-20> direction (long-axis direction).

As illustrated in the cross-sectional surface SEM image (the lower stage of (a1) ire FIG. 10), the voids CH at a depth of about 243 mu were formed in the n-guide layer 14. The void CH is a hole portion (hole) opening to the upper surface of the n-guide layer 14 and has an approximately oval columnar shape except for the bottom portion. Note that, in this specification, when the void CH formed by etching before being embedded inside the n-guide layer 14 is specifically distinguished from the void 14C forced after the embedding, the void CH will be described referred to as a "hole portion" CH.

Note that, alhough the etching is performed to be approximately perpendicular to the n-guide layer 14 (GaN layer) using the mask to expose the two {10-10} planes as the side surfaces, these two side surfaces need not to be the perfect {10-10} planes and only need to be surfaces along the {10-10} planes. The side surfaces may be surfaces slightly inclined from the {10-10} planes om tray have a curved surface shape. Moreover, the side surfaces only need to be surfaces such that the {10-10} planes are exposed by mass transport described later. Including these cases, this specification will describe that the void (hole portion) CH has the polygonal prism structure or the oval columnar structure having the two {10-10} planes parallel to the <11-20> direction as the side surfaces.

While the description has been given with the example in which the through-holes having the oval (rounded rectangular) shape are formed in the resist RZ to form the voids CH inside the n-guide layer 14, through-holes having a hexagonal shape with a long axis and a short axis may be formed in the resist RZ to form the voids CH.

[Embedding of Voids]

Subsequently, the SiNx film SN of the substrate (also referred to as the guide layer substrate) in which the voids CH having two-dimensional periodicity were formed in the n-guide layer 14 was removed using hydrofluoric acid (HF), degreasing and cleaning were performed to obtain the cleaned surfaces, which was introduced in the MOVPE apparatus again.

Figure 11:
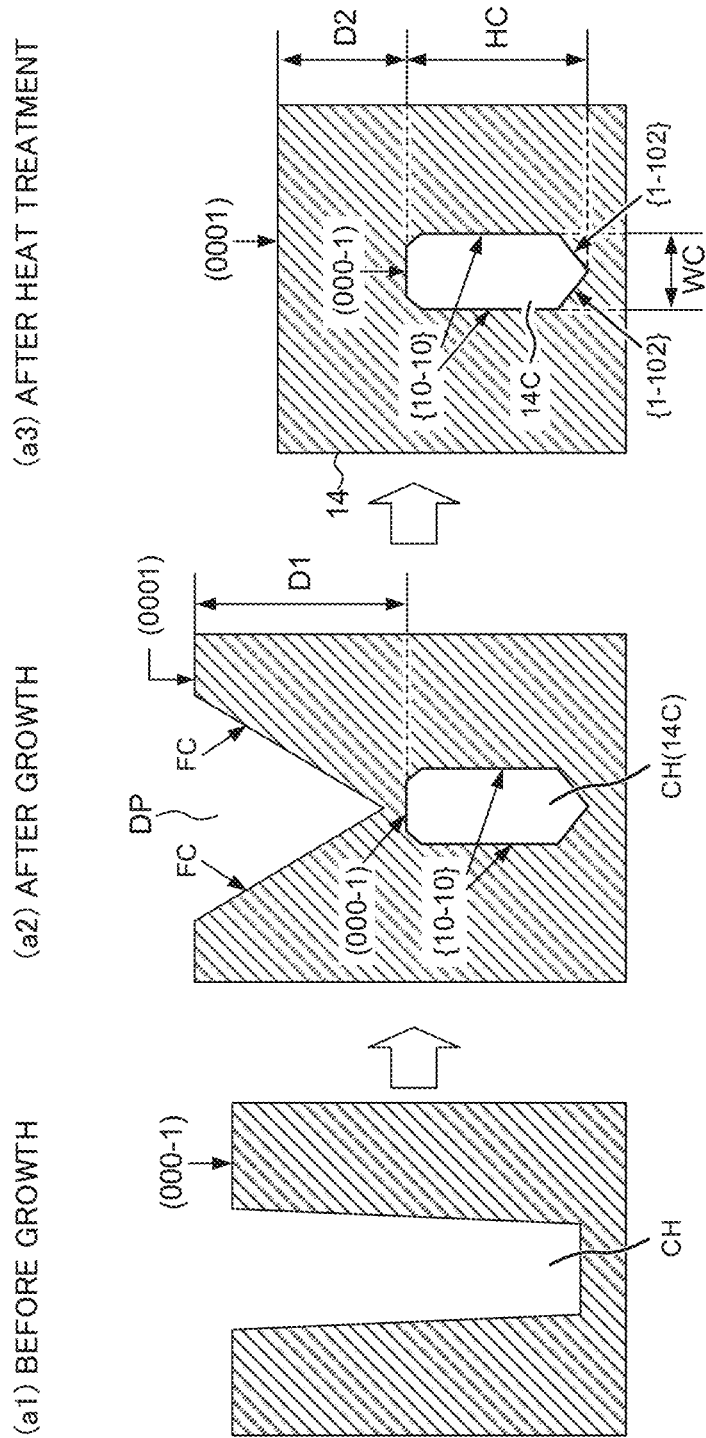
FIG. 11 includes cross-sectional views schematically illustrating an outline of an embedding step of the void CH.

Using the MOVPE apparatus, the voids CH were embedded. FIG. 11 includes cross-sectional views schematically illustrating an outline of this embedding step. Note that FIG. 11 illustrates the cross-sectional surfaces perpendicular to the <11-20> direction.

First, the guide layer substrate ((a1) in FIG. 11) in which the voids CH were formed was heated to a temperature of 1100° C. (growth temperature), and the group III material gas (TMG) and the group V material gas (NH$_3$) were supplied to obstruct the voids CH.

More specifically, the growth was performed so as to form a depressed portion DP on the void CH, and the opening of the void CH was closed. That is, as an elapse of the growth time, facets FC preferentially grown, and the facets FC growing from the mutually opposed surfaces collided with one another, thus obstructing the void CH ((a2) in FIG. 11). A (000-1) plane appears in a surface (upper surface) on the active layer 15 side of the embedded void CH, the {10-10} planes appear in the side surfaces of the void CH, and a {1-102} facet appears in a bottom portion on the substrate 12 side of the void CH.

Next, the surface was flattened. After the void CH was obstructed, the supply of the group III material gas was stopped, the group V material gas (NH$_3$) was being supplied while the temperature was increased up to 1200° C., and the temperature was held. After holding the temperature (heat treatment) at 1200° C. for one minute, the facets FC formed on the surfaces of the n-guide layer 14 disappeared, and thus the flat (0001) plane was formed. That is, the n-guide layer 14 with the flattened surface was obtained by mass transport. The void 14C embedded into the n-guide layer 14 has the two {10-10} planes parallel to the <11-20> direction (long-axis direction) as the side surfaces (sidewalk).

Note that while the supply of the group III material gas was stopped in the heat treatment step to obtain the flat surface by mass transport here, the group III raw material gas may be supplied.

That is, as illustrated in (a2) the cross-sectional surface of the voids after the embedding and growth in FIG. 10 (the SEM image on the upper stage), the voids 14C having the hexagonal columnar structure having the hexagonal cross-sectional surface that has the long-axis direction (the p-direction) in the <11-20> direction, the length in the long-axis direction of 90 nm, and the length (width) in the short-axis direction of 35 nm were formed in the surface (c place) parallel to the photonic crystal layer 14P.

That is, the void 14C has the {10-10} planes (or the m planes) parallel to the long-axis direction of the void 14C as the two side surfaces (sidewalls), the length (width) in this long-axis direction of these two side surfaces of 90 nm, and an interval WC between these two side surfaces of 35 nm. Additionally, the other four side surfaces (sidewalls) are the facets of the {10-10} planes.

The voids 14C were formed so as to be arranged at the interval of 161 nm at the square lattice positions while inclined with respect to the two-dimensional arrangement directions (the x-direction and the y-direction) by the inclination angle θ=30°.

FIG. 11 includes cross-sectional views schematically illustrating details of one example of the cross-sectional shape of the void 14C in the surface perpendicular to this long-axis direction corresponding to (a2) the cross-sectional surface (the SEM image on the lower stage) after the embedding and growth in FIG. 10.

As illustrated in (a3) after heat treatment in FIG. 11, the upper surface of the void 14C was the (000-1) plane, and a depth HC of the void 14C was 179 nm. Additionally, a distance D2 between the flat surface ((0001) plane) of the n-guide layer 14 and the upper surface ((000-1) plane) of the void 14C was approximately 85 nm and is smaller than a distance D1 ((a2) in FIG. 11) before the surface flattening by mass transport. The filling factor (FF) in this case was about 10%.

Note that, as described above, although the void 14C has the polygonal prism shape or the oval columnar shape, a shape of a part of the bottom portion or the upper portion may be different. For example, in this embodiment, as illustrated in FIG. 11, the facets may appear in the botto n portion of the void 14C. Specifically, for example, the void 14C may have a polygonal pyramid shape (hexagonal pyramid shape) in which the {1-102} facets are provided in the bottom portion on the n-clad layer 13 side of the void 14C or this bottom portion is formed of the {1-102} facets. In other words, the void 14C only needs to have a polygonal prism or an oval columnar portion. This specification will give the description that the void 14C has the polygonal prism structure or the oval columnar structure including these cases.

As described above in detail, the voids 14C that are arranged at the square lattice positions at the constant interval (PC) and have the predetermined inclination angle θ with respect to these arrangement directions (the x-direction and the y-direction) in the surface parallel to the photonic crystal layer 14P are formed.

The respective voids 14C inside the photonic crystal layer 14P are aligned and arranged in the depth direction so as to have the approximately same depth (a depth of the upper surface of D2) in the n-guide layer 14. Therefore, the upper surface of each void 14C formed inside the photonic crystal layer 14P forms the upper surface of the photonic crystal layer 14P. Additionally, the voids 14C inside the photonic crystal layer 14P have the approximately same height HC. That is, the photonic crystal layer 14P is formed so as to have the layer thickness HC. The n-guide layer 14 has the flat surface.

As described above, etching using the mask forms the void CH having the two {10-10} planes parallel to the <11-20> direction as the side surfaces (sidewalls) inside the n-guide layer 14 (GaN). This reduces a change in the shape of the void CH generated while the void CH is embedded. By the mass tra sport in the embedding step of the GaN-based crystal, the void shape changes so as to have the smallest surface energy.

That is, the side surfaces of the void CH change to the {10-10} planes where a dangling density is small. Therefore, reliminarily configuring the side surfaces of the void CH as the surfaces along the {10-10} planes, that is, the stable side surfaces, allows reducing the shape change due to the mass transport. As a result, the void can be embedded with the void shape before the embedding maintained even embedded.

Embedding Voids (Comparative Example)

Figure 12:
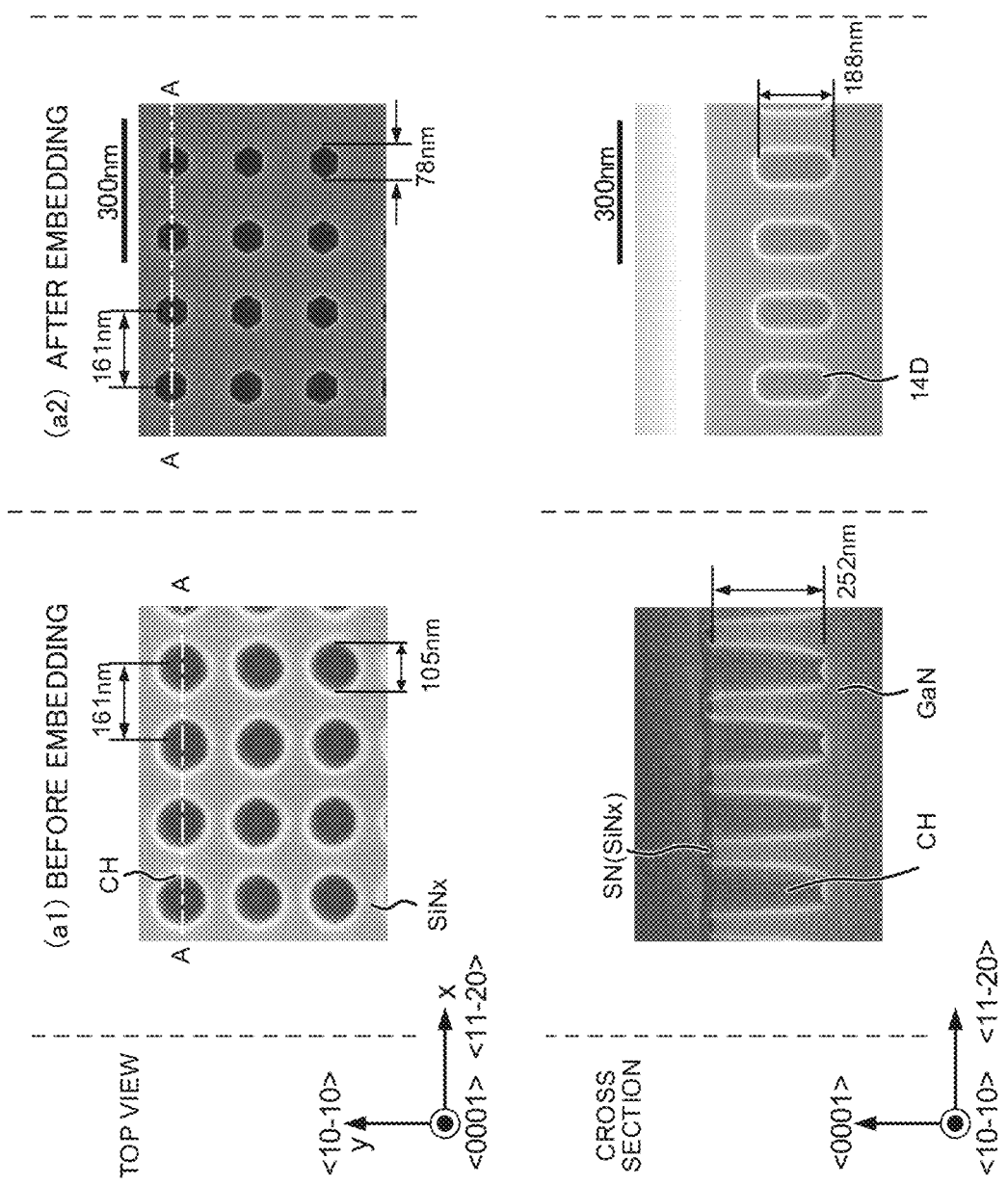
FIG. 12 includes SEM images illustrating formation of voids 14D as Comparative Example 1.

Although FIG. 12 includes drawings similar to FIG. 11, FIG. 12 includes SEM images illustrating formation of voids 14D as Comparative Example 1. In FIG. 12, with reference to (a1) the SEM image on the upper stage before the embedding, the drawing illustrates a case where the voids CH (columns) having a circular (true circular) cross-sectional surface having a structure asymmetric with respect to the arrangement directions (the x-direction and the y-direction) of the voids (holes) CH in the surface parallel to the n-guide layer 14 are embedded.

More specifically, the voids CH two-dimensionally arranged at the square lattice positions at this in-plane interval PC of 161 nm and having a depth of about 252 nm were formed by the steps similar to those in this embodiment. This circle was 105 nm in diameter.

The voids CH were embedded by the steps similar to those in the embodiment. With reference to the SEM image in this case ((a2) after embedding in FIG. 12), the void 14D formed by the embedding had a regular hexagonal columnar shape.

That is, the void 14D after the embedding had a structure that had the regular hexagonal columnar shape, had the six side surfaces as the {10-10} planes, and was symmetrical with respect to the arrangement directions.

Figure 13:
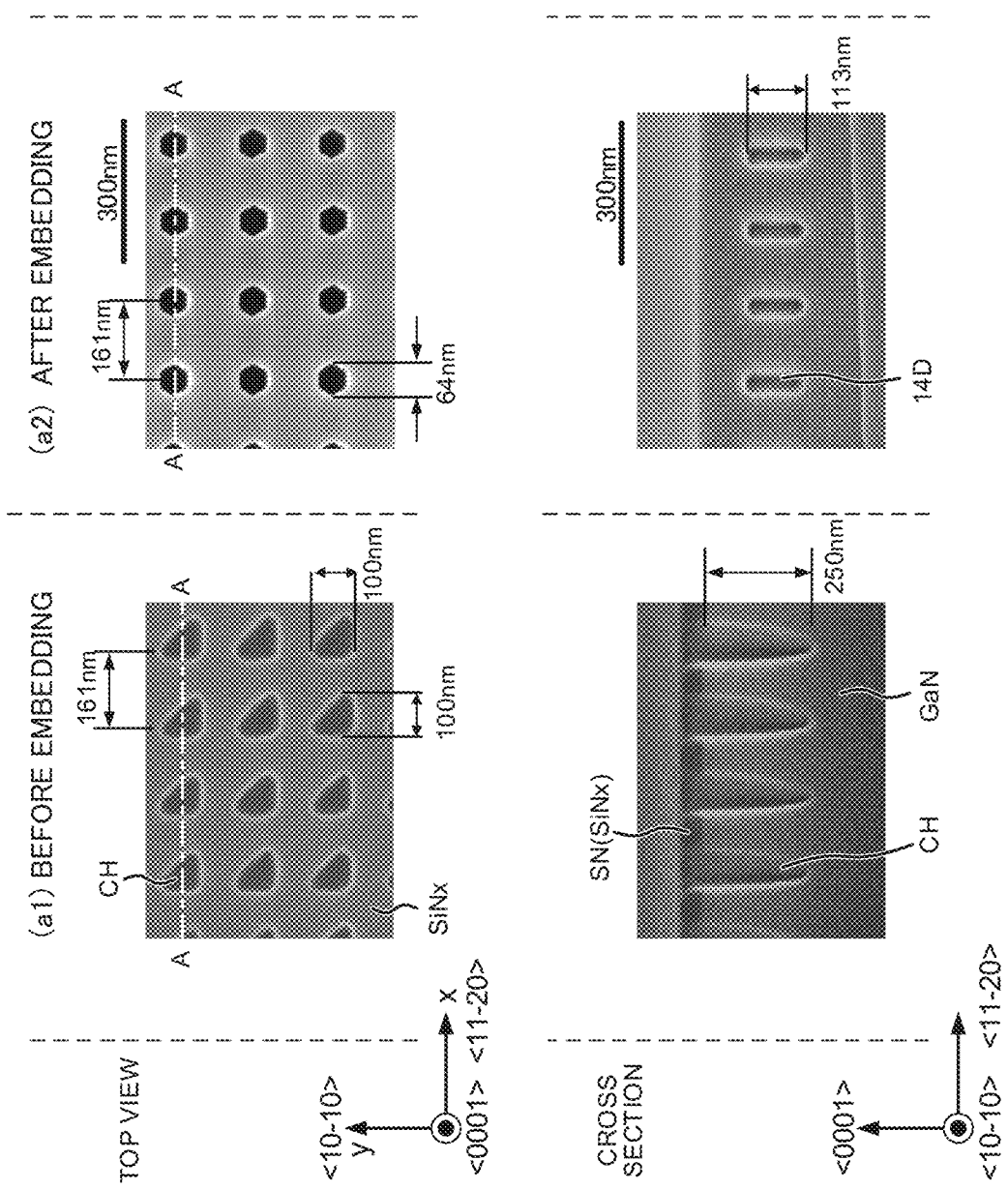
FIG. 13 includes SEM images illustrating the formation of the voids 14D as Comparative Example 2.

Additionally, while FIG. 13 includes drawings similar to FIG. 11 and FIG. 12, FIG. 13 includes SEM images illustrating formation of the voids 14D as Comparative Example 2. In FIG. 13, with reference to (a1) the SEM image on the upper stage before embedding, the drawing illustrates a case where the voids CH (triangular prisms) having an isosceles triangular shape as a cross-sectional surface, which is an asymmetric structure with respect to the arrangement directions (the x-direction and the y-direction) of the voids (holes) CH, in the surface parallel to the n-guide layer 14 were embedded.

More specifically, these voids CH at a depth of about 250 nm two-dimensionally arranged at the square lattice positions at the in-plane interval PC of 161 nm were formed by the steps similar to those of this embodiment. Equal sides of this isosceles triangle were 100 nm.

Then, the voids CH were embedded by the steps similar to those of the embodiment. With reference to the SEM image in this case ((a2) after embedding in FIG. 13), the voids 14D formed by the embedding had a regular hexagonal columnar shape.

That is, in Comparative Example 2, the void shape after the embedding had a structure where the asymmetry disappeared and symmetry appeared with respect to the arrangement directions. It is found that even when the void shape before the embedding is asymmetric, when the surfaces along the {10-10} planes are not provided, the change of the respective side surfaces (sidewalls) to the {10-10} planes after the embedding provides the symmetrical structure to the void shape after the embedding.

[Growth of Active Layer and p-Type Semiconductor Layer]

Subsequently, as the active layer 15, a multiple quantum well (MQW) layer including three-layer quantum well layers was grown. A barrier layer and the well layer of the multiple quantum well layer were made of GaN and InGaN, respectively, and layer thicknesses were 6.0 nm and 3.5 nm, respectively. Additionally, a center wavelength of PL emission from the active layer in this embodiment was 410 nm.

Note that the barrier layer was grown by decreasing the growth temperature to 800° C. and supplying triethylgallium (TEG) and $NH_3$. The well layer was grown by supplying the TEG, the trimethyl indium (TMI), and $NH_3$ at the temperature same as that of the barrier layer.

After the growth of the active layer 15, the substrate was maintained at 800° C. to grow the guide layer 16 (layer thickness: 100 nm) as a guide layer of a p-side. A dopant was not doped to the guide layer 16 to grow a non-doped GaN layer. The guide layer 16 is not limited to the non-doped GaN layer but can be configured as a p-type GaN layer to which Mg is doped or into which Mg diffuses.

With a growth temperature increased to 1050° C., an Electron Blocking Layer (EBL) 17 and the p-clad layer 18 were grown on the guide layer 16. The electronic barrier layer 17 and the p-clad layer 18 were grown by supplying TMG, TMA, and $NH_3$.

The electronic barrier layer 17 was an AlGaN layer (layer thickness: 15 nm) with an Al composition of 18%, and the p-clad layer 18 was an AlGaN layer (layer thickness: 600 nm) with an Al composition of 6%. To grow the electronic barrier layer 17 and the p-clad layer 18, bis-cyclopentadienyl magnesium ($CP_2Mg$) was supplied, and a carrier density was $4\times10^{17}$ $cm^{-3}$.

The above-described method allowed obtaining the surface emission laser reducing the high-order transverse mode and exhibiting stable basic lateral mode oscillation even during high output. Additionally, the method allowed obtaining the surface emission laser obtaining a stable beam shape (for example, a Gaussian shape) regardless of output and having high beam quality.

The surface emission laser that has the photonic crystal having the uniform refractive index cycle and having the high diffraction effect, and the manufacturing method of the surface emission laser can be provided. Additionally, the surface emission laser that has the photonic crystal having the large filling factor and the large optical confinement factor, and the manufacturing method of the surface emission laser can be provided.

As described above in detail, the shape of the voids periodically arranged at the lattice points of the photonic crystal is formed to be asymmetric with respect to these arrangement directions (periodic directions) to enhance the two-dimensional coupling in the photonic crystal.

For example, as described in Comparative Examples 1 and 2, in a case where the shape of the voids arranged at these lattice points are configured to be the regular hexagon (regular hexagonal column) highly symmetrical with respect to the periodic directions, the two-dimensional coupling of the light by diffraction in the photonic crystal weakens. Accordingly, photons do not spread to the entire plane, and therefore the high-order mode is likely to occur in the photonic crystal surface emissionlaser That is, the multiple modes occur, resulting in deterioration of beam quality. Especially, in a case where an oscillation area is enlarged or the high output operation is performed, this phenomenon strongly appears.

Further, in the GaN-based photonic crystal surface emission laser, even when the void shape before a buried growth is configured to be asymmetric, the void shape changes to have the symmetrical structure in the buried growth, and therefore the asymmetric voids cannot be obtained (for example, Comparative Example 2 described above).

Therefore, according to the present invention, the photonic crystal surface emission laser including the photonic crystal layer having asymmetry, exhibiting the stable basic lateral mode oscillation, and featuring the high beam quality can be achieved.

Note that while the structure of the surface emission laser formed by growing the semiconductor structure layer 11 on the substrate 12 as the growth substrate has been described as the example in the above-described method, a structure in which, after a supporting substrate different from the growth substrate is pasted to the side opposite to the growth substrate of the semiconductor structure layer 11, the growth substrate is removed can be employed. In such a structure, a reflection layer or a reflective electrode layer can be appropriately formed between the semiconductor structure layer 11 and the supporting substrate.

DESCRIPTION OF REFERENCE SIGNS

10: photonic crystal surface emission laser
12: substrate

13: n-clad layer
14: n-guide layer
14P: photonic crystal layer
14C: voids
15: active layer
16: guide layer
18: p-clad layer

The invention claimed is:

1. A surface emission laser formed of a group Ill nitride semiconductor comprising:
a first conductivity type first clad layer;
a first conductivity type first guide layer on the first clad layer;
a light-emitting layer on the first guide layer;
a second guide layer on the light-emitting layer; and
a second conductivity type second clad layer on the second guide layer, the second clad layer having a conductivity type opposite to the first conductivity type,
wherein:
the first guide layer or the second guide layer internally includes voids periodically arranged at square lattice positions with two axes perpendicular to one another as arrangement directions in a surface parallel to the guide layer,
the voids have a polygonal prism structure or an oval columnar structure having a polygonal shape or an oval shape with a long axis and a short axis perpendicular to the long axis in the parallel surface, and the long axis is inclined with respect to one axis among the arrangement directions of the voids by an inclination angle θ, and
the inclination angle θ is 45°.

2. The surface emission laser according to claim 1, wherein the surface parallel to the first guide layer is a (0001) plane, the long axis has a direction in an <11-20> direction, and the voids have two side surfaces as {10-10} planes parallel to the long axis.

3. The surface emission laser according to claim 2, wherein the voids have a hexagonal columnar structure in which four side surfaces other than the two side surfaces are {10-10} planes.

4. A surface emission laser formed of a group Ill nitride semiconductor comprising:
a first conductivity type first clad layer;
a first conductivity type first guide layer on the first clad layer;
a light-emitting layer on the first guide layer;
a second guide layer on the light-emitting layer; and
a second conductivity type second clad layer on the second guide layer, the second clad layer having a conductivity type opposite to the first conductivity type,
wherein:
the first guide layer or the second guide layer internally includes voids periodically arranged at square lattice positions with two axes perpendicular to one another as arrangement directions in a surface parallel to the guide layer,
the voids have a hexagonal columnar structure having a hexagonal shape with a long axis and a short axis perpendicular to the long axis in the parallel surface, and the long axis is inclined with respect to one axis among the arrangement directions of the voids by an inclination angle θ, and
the surface parallel to the first guide layer is a (0001) plane, the long axis has a direction in an <11-20> direction, six side surfaces of the voids are {10-10} planes, and bottoms of the voids have a {1-102} facet.

5. A surface emission laser formed of a group Ill nitride semiconductor comprising:
a first conductivity type first clad layer;
a first conductivity type first guide layer on the first clad layer;
a light-emitting layer on the first guide layer;
a second guide layer on the light-emitting layer; and
a second conductivity type second clad layer on the second guide layer, the second clad layer having a conductivity type opposite to the first conductivity type,
wherein:
the first guide layer or the second guide layer internally includes voids periodically arranged at square lattice positions with two axes perpendicular to one another as arrangement directions in a surface parallel to the guide layer,
the voids have a polygonal prism structure or an oval columnar structure having an elongated polygonal shape or an oval shape with a long axis and a short axis perpendicular to the long axis in the parallel surface, and the long axis is inclined with respect to one axis among the arrangement directions of the voids by an inclination angle θ, and
an aspect ration of a cross-sectional shape of the voids in the parallel surface expressed by AR=a/b is at least 1.4 and at most 9.8, where a represents a length of the long axis and b represents a length of the short axis.

6. The surface emission laser according to claim 5, wherein the inclination angle satisfies 30°≤θ≤45°.

7. The surface emission laser according to claim 5, wherein the inclination angle θ is 45°.

8. The surface emission laser according to claim 5, wherein a filling factor satisfies 4%≤FF≤16%, the filling factor being obtained by FF=πab/PC$^2$
where,
PC represents one interval of periodical arrangement of the voids,
PC$^2$ represents an area of one interval PC, and
πab represents an area of the polygonal shape or the oval shape.

9. The surface emission laser according to claim 5, wherein the surface parallel to the first guide layer is a (0001) plane, the long axis has a direction in an <11-20> direction, and the voids have two side surfaces as {10-10} planes parallel to the long axis.

10. The surface emission laser according to claim 9, wherein the voids have a hexagonal columnar structure in which four side surfaces other than the two side surfaces are {10-10} planes.

11. The surface emission laser according to claim 10, wherein bottoms of the voids have a {1-102} facet.

12. The surface emission laser according to claim 5, wherein the first conductivity type is n type, the second conductivity type is p type, and the first guide layer internally includes the voids.

* * * * *